United States Patent
Sharma et al.

(10) Patent No.: US 9,009,644 B1
(45) Date of Patent: Apr. 14, 2015

(54) AUTOMATIC GENERATION OF VIA DEFINITIONS BASED ON MANUFACTURABILITY

(71) Applicant: Freescale Semiconductor, Inc., Austin, TX (US)

(72) Inventors: Puneet Sharma, Austin, TX (US); Chi-Min Yuan, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/136,057

(22) Filed: Dec. 20, 2013

(51) Int. Cl.
*G06F 17/50* (2006.01)
(52) U.S. Cl.
CPC ................... *G06F 17/5081* (2013.01)
(58) Field of Classification Search
USPC ......................................................... 716/122
See application file for complete search history.

(56) References Cited

U.S. PATENT DOCUMENTS

| 5,798,937 A | 8/1998 | Bracha et al. |
| 2007/0101307 A1* | 5/2007 | Ueda ............................... 716/10 |
| 2008/0127024 A1* | 5/2008 | Bowers et al. .................. 716/12 |
| 2009/0294981 A1* | 12/2009 | Smayling et al. ............. 257/773 |

OTHER PUBLICATIONS

Huang-Yu Chen et al."Full-Chip Routing Considering Double-Via Insertion", IEEE Transactions on Computer-Aided Designs of Integrated Circuits and Systems, vol. 27, No. 5, May 2008, 14 pages.

* cited by examiner

*Primary Examiner* — Paul Dinh
*Assistant Examiner* — Bryce Aisaka

(57) ABSTRACT

A layout system automatically generates via definitions for a routing tool based on manufacturability of vias based on the via definitions. A physical verification tool of the system applies a set of preliminary via definitions to an integrated circuit test design at each of a plurality of offsets from a plurality of via locations to generate a set of candidate via definitions. Candidate via definitions that violate one or more design rules are discarded. A hierarchy constructor tool ranks the resulting candidate via definitions based on a combination of their manufacturability and frequency of applicability in the test design, and a predefined number of the candidate via definitions are selected based on their ranking. These selected via definitions can be used by a routing tool to generate a layout for another (non-test) integrated circuit device.

8 Claims, 4 Drawing Sheets

AUTOMATIC GENERATION OF VIA DEFINITIONS BASED ON MANUFACTURABILITY

BACKGROUND

1. Field of the Disclosure

The present disclosure relates generally to integrated circuit devices and more particularly to vias for integrated circuit devices.

2. Description of the Related Art

An integrated circuit device typically includes vias to connect different metal layers of the integrated circuit device. The vias can have different shapes, surrounding metal area, and other characteristics that determine the reliability and manufacturability of the vias. A via design having a particularly high level of reliability and manufacturability is referred to as a design-for-manufacturability, or DFM, via. Typically, the greater the number of DFM vias in an integrated circuit device design, the greater the manufacturing yield and reliability of the integrated circuits resulting from the design.

It is typically desirable to include as many DFM vias in the integrated circuit device design as practical. However, because of design rule restrictions, layout issues, and other factors, DFM vias sometimes cannot be used in particular via locations of the integrated circuit device. Accordingly, during design of the integrated circuit device, a routing tool is sometimes used to identify via locations where DFM vias can be used. The routing tool is supplied with a plurality of via definitions, with each definition representing a different via design and associated DFM quality. At each via location, the routing tool attempts to use each via definition, and selects the definition that has the highest DFM quality and does not violate a routing rule or other design rule. The ability of the routing rule to improve the overall manufacturability of the integrated circuit device depends on the quality of the supplied via definitions. However, generation of the via definitions is typically done manually, consuming a large amount of time and engineering resources.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION OF EMBODIMENT(S)

FIGS. 1-4 illustrate techniques for automatically generating via definitions for a routing tool based on manufacturability of vias based on via definitions. To generate the via definitions, a physical verification tool applies a set of preliminary via definitions to an integrated circuit test design at each of a set of offsets from a plurality of via locations. A set of candidate via definitions are derived with each candidate via definition corresponding to a preliminary via definition and offset. The physical verification tool compares the candidate via definitions to one or more design rules, and the candidate via definitions that violate the design rules are discarded. A hierarchy constructor tool ranks the resulting candidate via definitions based on a combination of their manufacturability and frequency of applicability in the test design, and a predefined number of the candidate via definitions are selected based on their ranking. These selected via definitions can be used by a routing tool to generate a layout for another (non-test) integrated circuit device. Because the selected via definitions have been selected based on their manufacturability, overall manufacturability and yield of the integrated circuit device is improved. Further, because the selected via definitions were generated automatically, rather than manually, overall time to design and route the integrated circuit device is reduced.

Figure 1:
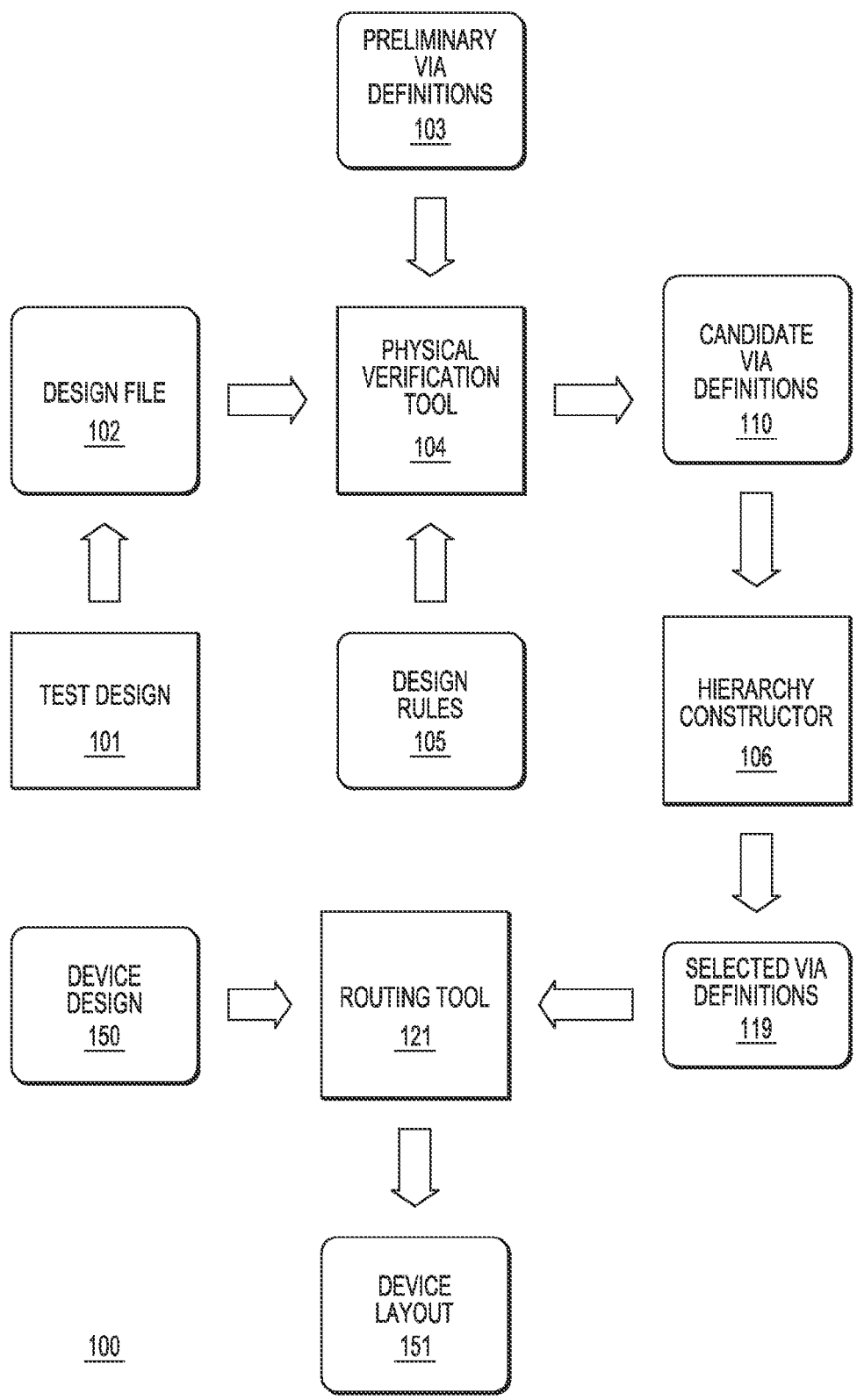
FIG. 1 is a block diagram of an integrated circuit layout system that automatically generates via definitions based on a set of preliminary via definitions applied to a test design in accordance with at least one embodiment.

FIG. 1 illustrates an integrated circuit (IC) layout system 100 in accordance with at least one embodiment. The IC layout system 100 is implemented at a computer system, such as a desktop computer, workstation, server, or combination thereof. The individual modules of the IC layout system 100 described below can reflect individual or collective software programs, hardware devices, or combinations thereof. Further, although illustrated and described individually, each of the modules described below can represent a portion of a larger software program, hardware device, or combination thereof.

The IC layout system 100 is generally configured to perform at least two operations: automatic generation of a set of selected via definitions 119 and use of the selected via definitions 119 to prepare an integrated circuit device layout 151 to be used to create integrated circuit devices corresponding to an integrated circuit device design 150. In at least one embodiment, the IC layout system 100 may be part of a larger system of design and testing tools to generated the integrated circuit device layout 151, wherein the system includes modules to perform design qualification tests, manufacturing qualification tests, verification tests, device timing tests, and the like.

To generate the selected via definitions 119, the IC layout system 100 employs a test design 101. The test design 101 reflects a layout for a test integrated circuit device, including one or more test structures and via locations for vias to connect metal layers of the test integrated circuit device. The test structures can reflect fully functional electrical circuits, such as processor cores, memory controllers, memory devices, and the like, or can be structures that do not reflect fully functional electrical circuits, but are structures that have characteristics similar to a functional electrical circuit. For example, the test structures may be collections of logic gates that are do not perform any useful function, but are arranged to consume a similar amount of area in an integrated circuit device as a functional structure, such as a processor core or memory area.

The test design 101 is reflected in a design file 102. In at least one embodiment, a portion of the test design 101 is first instantiated in a set of design requirements indicating specified behavior to be achieved by defined modules of the test design 101. Based on the design requirements, one or more designers can use a software development environment executing at one or more computer devices to generate the test design 101. For example, the designers can employ register transfer language (RTL) or other descriptor language to create computer-implemented modules that are expected to achieve the design requirements. The computer devices generate the design file 102 based on the computer implemented modules. In some embodiments, the design file 102 is generated as a machine interpretable (e.g. computer interpretable) file that describes the layout of the test design 101 according to a standard or proprietary format. The design file 102 thus describes each semiconductor layer of the test design 101 and the relative position of each test structure and via location in the test design 101.

To generate the selected via definitions 119, the IC layout system 100 first generates a set of candidate via definitions 110 using a physical verification tool 104 to iteratively apply a set of preliminary via definitions 103 to via locations of the test design 101 and to identify whether the resulting via positions would violate any of a set of design rules 105. The preliminary via definitions 103 are a set of predefined via definitions each describing a different via topology. In particular, each of the preliminary via definitions 103 describes a via having a corresponding via topology, consisting of the shape and area of the via itself, and the shape and area of any surrounding metal. A physical verification tool 104 assigns to each of the preliminary via definitions a corresponding initial manufacturability value, referred to herein as a DFM value. In at least one embodiment, the preliminary via definitions 103 are supplied by the semiconductor foundry or other manufacturer that is expected to manufacture integrated circuits based on the device design 150. Each DFM value reflects a corresponding combination of the relative ease with which the corresponding via topology can be manufactured by a semiconductor foundry or other manufacturer, and the expected reliability of the resulting via. For example, via topologies having a larger area of via and larger surrounding metal are typically assigned a higher initial DFM value, reflecting greater manufacturability and reliability, than topologies having smaller via areas and smaller surrounding metal layers. As described further herein, the initial DFM values are used to identify the expected manufacturability of the candidate via definitions 110 and the expected manufacturability is used to select particular candidate via definitions for particular via locations in the device layout 151 so that overall manufacturability of the integrated circuit devices based on the device layout 151 is improved.

The physical verification tool 104 is a design tool that can apply defined geometric structures, such as the preliminary via definitions 103, to any position of an integrated circuit layout, such as the layout of the test design 101 as reflected in the design file 102. In addition, the physical verification tool 104 can identify whether the application of the structures at a particular position violates any of the design rules 105. The design rules 105 can reflect recommended or required parameters indicating restrictions on how structures, including vias, can be placed in an integrated circuit layout. For example, the design rules can indicate required spacing between structures in the integrated circuit layout to ensure that structures do not interfere with each other.

The design file 102 indicates a set of recommended or expected locations where vias are to be placed in the test design 101. For purposes of description, these recommended or expected locations are referred to herein as "nominal via locations." In operation, the physical verification tool 104 applies (places) a via according to each of the preliminary via definitions 103 at each of a set of predefined offsets from each of the nominal via locations and identifies whether the application violates any of the design rules 105. Each of the predefined offsets reflects an x (horizontal) and y (vertical) offset from the nominal via location. To illustrate by way of an example, the preliminary via definitions can include definitions design Via Definition A, Via Definition B, and Via Definition C, with the resulting vias designated Via A, Via B, and Via C, respectively. The predefined offsets can be (0,0) (indicating the via is placed at the nominal via location), (+j, +k) (indicating the via is placed at an offset of +j in the x-direction and +k in the y-direction), and (−j, −k) (indicating the via is placed at an offset of −j in the x-direction and −k in the y-direction). The nominal via locations can be designated VL-1, VL-2, VL-3, and VL-4. The physical verification tool 104 first applies Via A at each of the set of predefined offsets relative to VL-1 (i.e. at VL-1+offset (0,0), VL-1+(+j,+k) and VL-1+(−j,−k)), and identifies whether each placement violates any of the design rules 105. The physical verification tool 104 then repeats the process for Via B and Via C.

Each via definition and offset pair represents a potential via definition for the device design 150. However, the device design 150 is expected to have similar design rules as the design rules 105, and employ similar structures as included in the test design 101. Accordingly, those pairs of via definitions and offsets that violate one of the design rules 105 are not expected to be useful for the device design 150, and are therefore discarded by the physical verification tool 104. The remaining via definition and offset pairs (those that do not violate any of the design rules 105) are stored as the candidate via definitions 110. The following table illustrates an example of the candidate via definitions 110 according to one embodiment, based on the example of Vias A, B, and C described above:

| Candidate Via Definition Designator | Preliminary Via Definition | Offset |
| --- | --- | --- |
| 1 | A | (0,0) |
| 2 | A | (+j,+k) |
| 3 | B | (+j,+k) |
| 4 | B | (−j,−k) |
| 5 | C | (0,0) |

Each of the candidate via definitions 110 thus represents a different pair of preliminary via definition and offset. In some scenarios, each of the candidate via definitions can be used by a routing tool 121 to place vias in the device layout 151 for the device design 150, as described further below. However, in many cases the number of candidate via definitions 110 is too large to be used by the routing tool 121, either because of limitations in the tool itself or because using all of the definitions would render the layout process for the device design 150 unreasonably inefficient. Accordingly, the IC layout system 100 includes a hierarchy constructor 106 to arrange the candidate via definitions in a hierarchy based on the initial DFM values for the preliminary via definitions for each of the candidate via definitions and based on the number of different offsets where each preliminary via definition is used. The hierarchy constructor 106 thus arranges the candidate via definitions 110 according to a combination of the manufacturability of each of the candidate via definitions and the frequency with which a particular via topology (as indicated by the preliminary via definitions) is likely to be used in the device layout 151. After ranking, the hierarchy constructor 106 selects a threshold number of the candidate via definitions 110 based on their ranking (e.g. selecting the highest N ranked candidate via definitions) and stores the selected via definitions as the selected via definitions 119.

To illustrate, in at least one embodiment the hierarchy constructor 106 selects the selected via definitions by constructing a bi-partite graph consisting of two sets of nodes, and links between the nodes. One set of nodes represents the preliminary via definitions reflected in the candidate via definitions 110 and the other set of nodes represents the offsets reflected in the candidate via definitions 110. A link between nodes of the two sets reflects that the two corresponding nodes form one of the candidate via definitions 110. The hierarchy constructor 106 weights each link according to the initial DFM value of its corresponding preliminary via definition. The hierarchy constructor 106 then selects the preliminary via definition node having links with the highest total weight. For the corresponding offset nodes, the hierarchy constructor 106 re-weights their connected links that are not connected to the selected preliminary via definition node. An example of this process is described in greater detail below with respect to FIG. 3. If a link weight falls below a threshold value (e.g. zero) by the re-weighting, the link is "eliminated" so that the corresponding one of the candidate via definitions 110 is omitted from the selected via definitions 119. The hierarchy constructor 106 continues to iteratively re-weight the links until there remains only a threshold number of links that have not been eliminated. The hierarchy constructor 106 selects those ones of the candidate via definitions 110 corresponding to the links that have not been eliminated, and stores the selected definitions as the selected via definitions 119.

The routing tool 121 uses the selected via definitions 119 to generate the device layout 151 based on the device design 150. For example, in one embodiment, the device design 150 is represented by a data file that indicates a set of nominal via locations for the layout of the device. At each of the nominal via locations, the routing tool tests each of the selected via definitions 119 by placing a via based on the corresponding preliminary via definition at the corresponding offset indicated by the selected via definition. The routing tool 121 then assigns a manufacturability score to the placed via based on the initial DFM value associated with the preliminary via definition and on other manufacturability factors. The routing tool 121 then compares the manufacturability scores for each of the selected via definitions 119 at each of the nominal via locations and assigns, for each nominal via location, the selected via definition having the high manufacturability score at that location. The routing tool 121 then uses the assigned via definitions to generate the device layout 151. The manufacturability and reliability of the device layout 151 is thereby enhanced.

Figure 2:
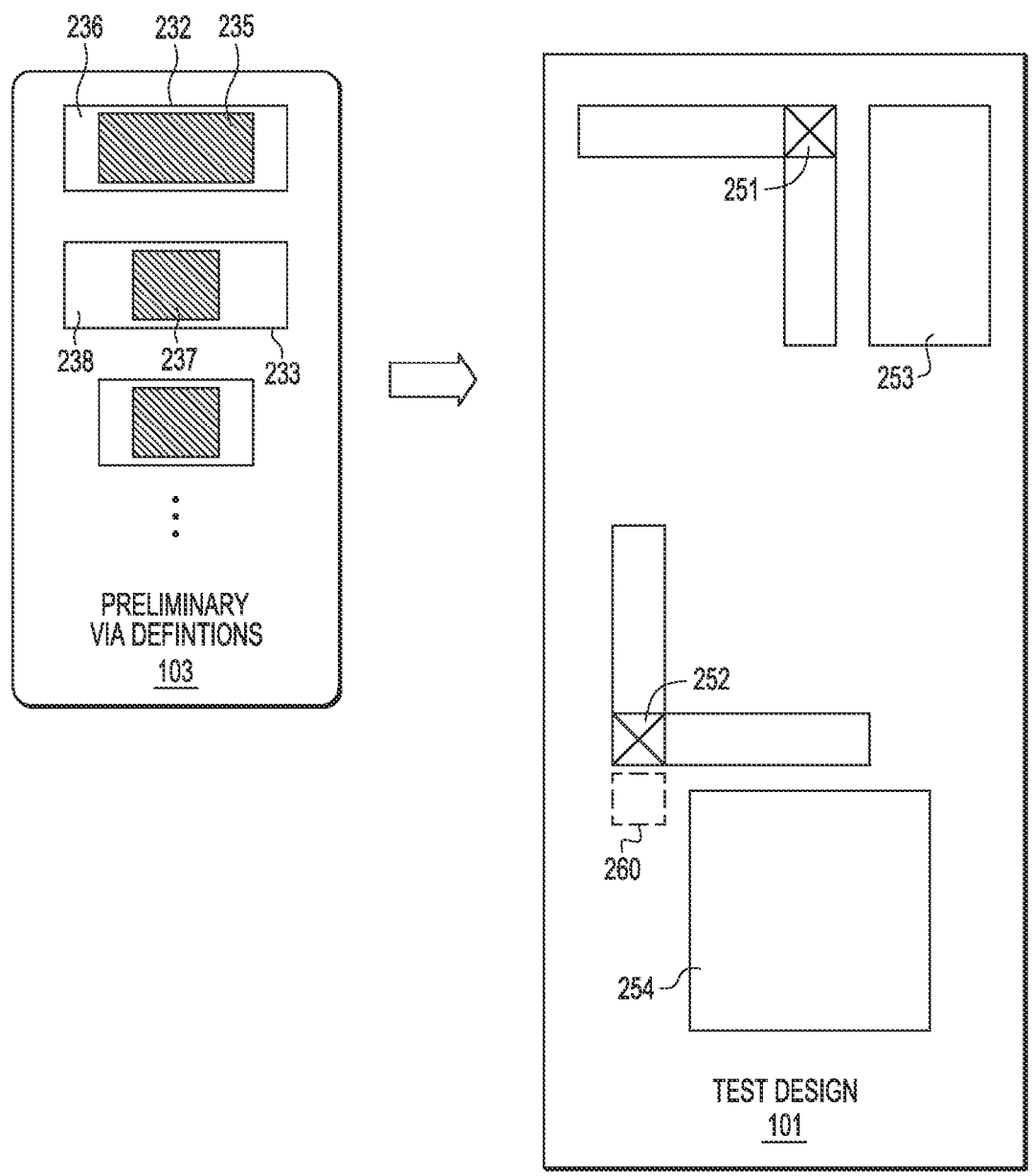
FIG. 2 is a block diagram illustrating application of preliminary via definitions to the test design of FIG. 1 in accordance with at least one embodiment.

FIG. 2 is a block diagram illustrating application of preliminary via definitions to the test design of FIG. 1 in accordance with at least one embodiment. In the illustrated example, each of the preliminary via definitions 103 reflects a different combination of via topology and topology of surrounding metal. For example, preliminary via definition 232 reflects a via with a generally rectangular via topology 235 and a surrounding metal topology 236 that is also rectangular and surrounds the via topology 235. Preliminary via definitions 233 has similar overall shapes for its via topology 237 and surrounding metal topology 238, but the area of the via topology 237 is smaller than that of via topology 235. Accordingly, preliminary via definition 233 is likely to have a smaller initial DFM value than via definition 234, because its smaller via topology is likely to be more difficult to manufacture and be less reliable.

FIG. 2 also illustrates an example of the test design 101. In the illustrated example, the test design 101 includes nominal via locations 251 and 252, and test structures 253 and 254. In operation, the physical verification tool 104 selects one of the preliminary via definitions 103 and selects one of the nominal via locations (e.g. nominal via location 252). For each of the predetermined set of offsets, the physical verification tool 104 places a via based on the selected preliminary via definitions at the location indicated by the selected nominal via location and the offset. The physical verification tool then identifies whether the placed via causes a violation of any of the design rules 105. If so, the offset and via definition are not recorded as one of the candidate via definitions 110, at least for that nominal via location (the combination of offset and via definition may not violate any of the design rules 105 at another of the nominal via locations, and may be recorded as one of the candidate via definitions 110 based on the combination's legality at the other nominal via location). If the placed via does not result in violation of any of the design rules 105, the combination of selected via definition and offset are recorded as one of the candidate via definitions 110.

For example, location 260 illustrated at FIG. 2 represents the location resulting from the combination of the nominal via location 252 and one of the predetermined set of offsets. Accordingly, the physical verification tool 104 places a via based on the selected via definition at location 260 and identifies whether the placed via violates any of the design rules 105. For example, in some scenarios an edge of the placed via is too close to test structure 254, violating one of the design rules 105. Accordingly, in such scenarios the physical verification tool 104 will not record the selected via definition and offset pair as one of the candidate via definitions based on the placement of the via at location 260. In other scenarios, the design rules 105 are such that the placement of the via at location 260 does not violate any design rule, and the physical verification tool 104 therefore records the offset and selected via definition pair as one of the candidate via definitions 110.

Figure 3:
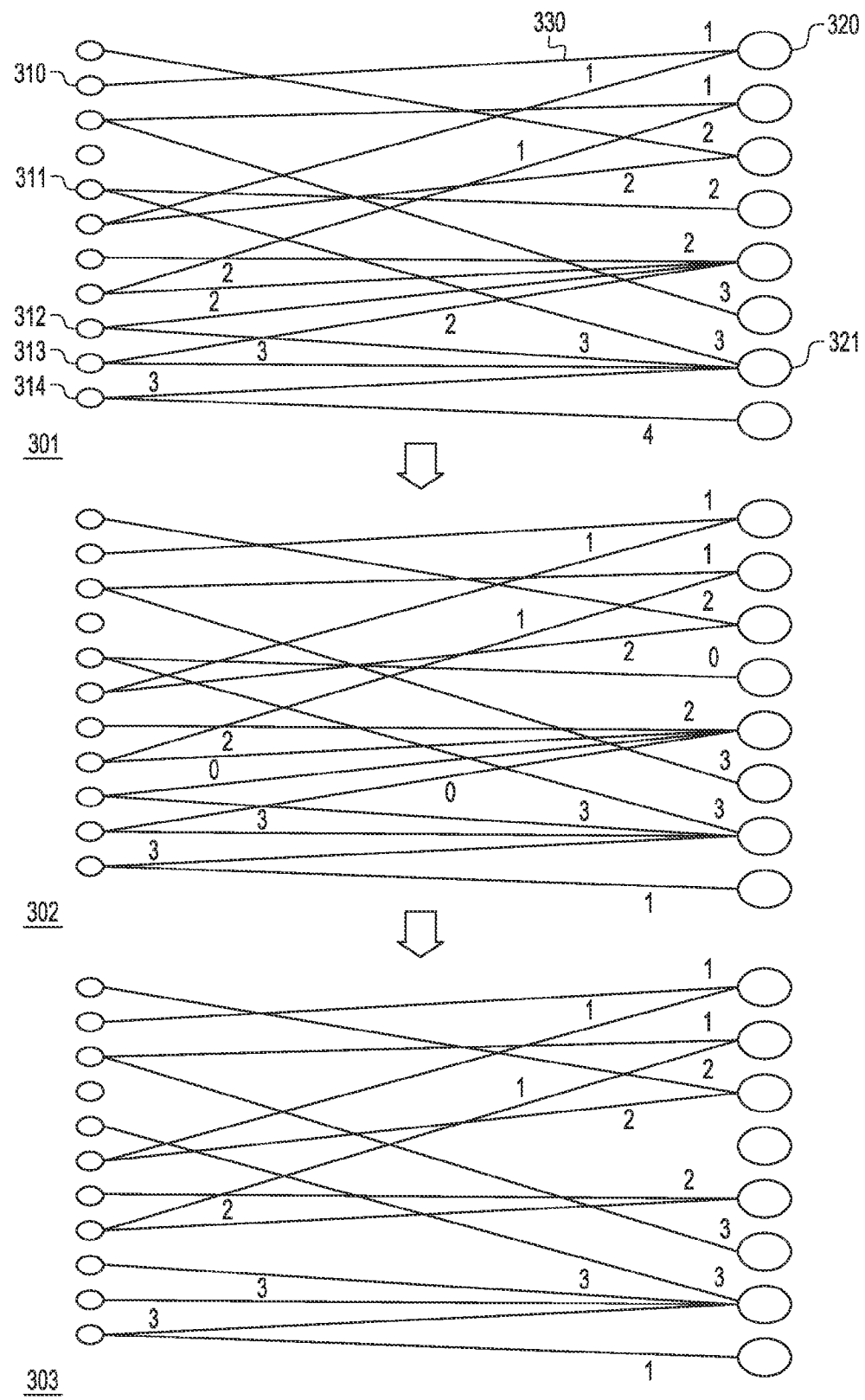
FIG. 3 is a diagram illustrating ranking and selection of via definitions from a set of candidate via definitions in accordance with at least one embodiment.

FIG. 3 is a diagram illustrating the hierarchy constructor 106 selecting the selected via definitions 119 in accordance with at least one embodiment. In the illustrated example of FIG. 3, at view 301 the hierarchy constructor 106 constructs two sets of nodes: 1) offset nodes (illustrated on the left of FIG. 3), each representing a corresponding one of the offsets reflected in the candidate via definitions 119; and 2) preliminary via definition nodes, each representing a different one of the preliminary via definitions 103. The hierarchy constructor 106 then establishes a corresponding link between each pair of offset node and preliminary via definition node that form one of the candidate via definitions 119. For example, the candidate via definitions 119 may indicate that one of the candidate via definitions is defined by a preliminary via definition, designated "Preliminary Via Definition A" at an offset of (+j, 0). Accordingly, the hierarchy constructor 106 constructs node 310 to represent offset (+j,0) and node 320 to represent Preliminary Via Definition A, and establishes a link 330 to indicate that the pair of Preliminary Definition A and offset (+j,0) represents one of the candidate via definitions 110. In the illustrated example, Preliminary Via Definition A is linked to different offset nodes, each link representing a different one of the candidate via definitions 119 that includes Preliminary Via Definition A. Similarly, offset node 310 is linked to different preliminary via definition nodes, each link representing a different one of the candidate via definitions 119 that includes offset (+j,0).

At view 301, the hierarchy constructor 106 has assigned a preliminary weight to each link where the preliminary weight for each link corresponds to the initial DFM value for its connected preliminary via definition node. For example, in the illustrated embodiment of FIG. 3, Preliminary Via Definition A has an initial DFM value of 1. Accordingly, each link connected to preliminary via definition node 320 (representing Preliminary Via Definition A) is assigned a value of 1.

After assigning a preliminary weight to each link, the hierarchy constructor 106 identifies which of the preliminary via definition nodes has links with the highest combined weight. In the example of FIG. 3, it selects node 321, whose links have a combined weight of 12. For purposes of description, this is referred to as the Selected Definition Node, and its connected links are referred to as the Selected Links. The hierarchy constructor 106 then identifies the offset nodes that are connected to the Selected Definition Node via the Selected Links. These are referred to for purposes of description as the Selected Offset Nodes. In the example of FIG. 3, these are nodes 311, 312, 313, and 314. The hierarchy constructor 106 then subtracts the weight of each Selected Link (i.e. 3 in the example of FIG. 3) from the weights of each link connected to each of the Selected Offset Nodes, except the Selected Links That is, the weights of the Selected Links are not adjusted, but the weights of all other links connected to one of the Selected Offset Nodes are adjusted. The results of this weight adjustment are illustrated at view 302 of FIG. 3.

As shown at view 302, the adjustment of the weights can cause some weights to fall to or below a threshold level of zero. The hierarchy constructor 106 eliminates the links for those weights, as illustrated at view 303. Elimination of a link causes the corresponding candidate via definition to be omitted from the selected via definitions 119. A link having an adjusted weight below zero represents a candidate via definition having a relatively low combination of manufacturability and likelihood that the definition can be used without violating one of the design rules 105. Accordingly, by ensuring that the candidate via definitions corresponding to links having low adjusted weights are eliminated, the hierarchy constructor 106 enhances the overall manufacturability of the selected via definitions 119.

In at least one embodiment, the hierarchy constructor 106 iteratively repeats the weight adjustment process until only a threshold number of links remains. In the event that the weight adjustment process for the Selected Node does not cause elimination of any links, the hierarchy constructor 106 selects, for the Selected Node, the preliminary via definition node having links with the next-highest combined weight. The hierarchy constructor 106 continues adjusting weights in a similar fashion as described until the threshold number of links remains. The hierarchy constructor 106 then selects the candidate via definitions corresponding to the remaining links for the selected via definitions 119.

Figure 4:
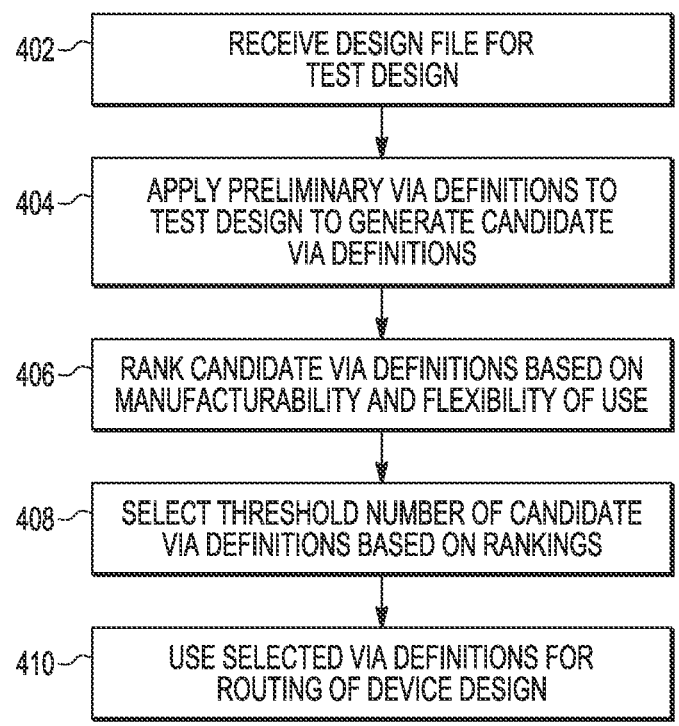
FIG. 4 is a flow diagram of a method of automatically generating via definitions based on the application of a set of preliminary via definitions to a test design in accordance with at least one embodiment.

FIG. 4 illustrates a method 400 of automatically generating via definitions for an integrated circuit design in accordance with at least one embodiment. For purposes of description, the method 400 is described with respect to an example implementation at the IC layout system 100 (FIG. 1). At block 402, the IC layout system 100 receives the design file 102 based on the test design 101. At block 404, the physical verification tool 104 applies, at each of the predefined offsets, the preliminary via definitions 103 to the nominal via locations of the test design 101. The physical verification tool 104 identifies which resulting via placements do not violate at least one of the design rules 105, and stores the corresponding candidate via definitions as the candidate via definitions 110.

At block 406, the hierarchy constructor 106 ranks the candidate via definitions 110 based on a combination of each candidate via definition's manufacturability (as indicated by the definition's corresponding preliminary via definition) and the candidate via definition's likely flexibility (as indicated by the number of offsets linked to the definition's corresponding preliminary via definition). At block 408, the hierarchy constructor 106 selects a threshold number of the candidate via definitions 110 according to their ranking and stores the selected definitions as the selected via definitions 119. At block 410, the routing tool 121 uses the selected via definitions to generate the device layout 151 for the device design 150.

In some embodiments, certain aspects of the techniques described above may implemented by one or more processors of a processing system executing instructions defined in code executable by the processors. The executable instructions may be stored or otherwise tangibly embodied on a non-transitory computer readable storage medium. The instructions and certain data can, when executed by the one or more processors, manipulate the one or more processors to perform one or more aspects of the techniques described above. The non-transitory computer readable storage medium can include, for example, a magnetic or optical disk storage device, solid state storage devices such as Flash memory, a cache, random access memory (RAM) or other non-volatile memory device or devices, and the like. The executable instructions stored on the non-transitory computer readable storage medium may be in source code, assembly language code, object code, or other instruction format that is interpreted or otherwise executable by one or more processors.

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A computer-implemented method comprising:
    applying, at a computer device, a plurality of preliminary via definitions to an integrated circuit test design to identify a set of candidate via definitions;
    generating and storing at the computer device data representing a set of selected via definitions based on a comparison of the candidate via definitions to a set of design rules, the set of selected via definitions to be used by a design tool for design of an integrated circuit device; and
    generating at the computer device a layout of the integrated circuit device based on the data representing the set of selected via definitions;

wherein generating the data representing the set of selected via definitions comprises:
generating the data representing the set of selected via definitions by ranking the set of candidate via definitions based on a design-for-manufacturability (DFM) characteristic;
wherein ranking the set of candidate via definitions comprises:
identifying, for each of the set of candidate via definitions, a set of offsets where a corresponding preliminary via definition can be used without violating any of the set of design rules; and
ranking the set of candidate via definitions based on the DFM characteristic and the identified set of offsets for each of the set of candidate via locations; and
wherein each of the set of candidate via definitions includes a corresponding preliminary via definition and offset, and herein generating the set of selected via definitions comprises:
establishing a set of links between the preliminary via definitions of the candidate via definitions and their corresponding offsets;
assigning a preliminary weight to each of the set of links based on the corresponding preliminary via definition's corresponding DFM characteristic;
adjusting the preliminary weight of at least one of the set of links based on the preliminary via definition associated with links having the highest total weight to identify a set of adjusted weights; and
generating the set of selected via definitions based on the set of adjusted weights.

2. The method of claim 1, wherein applying the plurality of preliminary via definitions comprises:
applying a first preliminary via definition of the plurality of preliminary via definitions at a first via location of the test design to generate a first candidate via definition of the set of candidate via definitions; and
applying the first preliminary via definition at a first offset from the first via location to generate a second candidate via definition of the set of candidate via definitions.

3. The method of claim 2, wherein applying the plurality of preliminary via definitions further comprises:
applying a second preliminary via definition of the plurality of preliminary via definitions at the first via location of the test design to generate a third candidate via definition of the set of candidate via definitions; and
applying the second preliminary via definition at the first offset from the first via location to generate a fourth candidate via definition of the set of candidate via definitions.

4. The method of claim 1, wherein adjusting the preliminary weight for the at least one of the set of links comprises:
identifying the preliminary via definition associated with links having the highest total weight;
identifying a first set of links connected to the identified preliminary via definition;
identifying a set of offsets connected to the identified first set of links;
identifying a second set of links connected to the set of offsets; and
generating a set of adjusted weights for the second set of links by subtracting the corresponding weight of one of the first set of links from the corresponding weights of the second set of links.

5. A non-transitory computer readable medium embodying a set of executable instructions, the set of executable instructions to manipulate at least one processor to perform a method comprising:
apply a plurality of preliminary via definitions to a test design of a test integrated circuit device to identify a set of candidate via definitions;
generate a set of selected via definitions based on a comparison of the candidate via definitions to a set of design rules, the set of selected via definitions to be used by a design tool for design of an integrated circuit device by:
identifying, for each of the set of candidate via definitions, a set of offsets where the corresponding preliminary via definition can be used without violating any of the set of design rules; and
ranking the set of candidate via definitions based on a design-for-manufacturability (DFM) characteristic and the identified set of offsets for each of the set of candidate via locations, wherein ranking comprises:
identifying, for each of the set of candidate via definitions, a set of offsets where the corresponding preliminary via definition can be used without violating any of the set of design rules; and
ranking the set of candidate via definitions based on the DFM characteristic and the identified set of offsets for each of the set of candidate via locations by:
establishing a set of links between the preliminary via definitions of the candidate via definitions and their corresponding offsets;
assigning a preliminary weight to each of the set of links based on the corresponding preliminary via definition's corresponding DFM characteristic; and
adjusting the preliminary weight of at least one of the set of links based on the preliminary via definition associated with links having the highest total weight to identify a set of adjusted weights; and
generating the set of selected via definitions based on the set of adjusted weights; and
generating a layout of an integrated circuit device based data representing the set of selected via definitions.

6. The computer readable medium of claim 5, wherein the set of executable instructions is to manipulate the at least one processor to apply the plurality of preliminary via definitions by manipulating the at least one processor to:
apply a first preliminary via definition of the plurality of preliminary via definitions at a first via location of the test design to generate a first candidate via definition of the set of candidate via definitions; and
apply the first preliminary via definition at a first offset from the first via location to generate a second candidate via definition of the set of candidate via definitions.

7. The computer readable medium of claim 6, wherein the set of executable instructions is to manipulate the at least one processor to apply the plurality of preliminary via definitions by manipulating the at least one processor to:
apply a second preliminary via definition of the plurality of preliminary via definitions at the first via location of the test design to generate a third candidate via definition of the set of candidate via definitions; and
apply the second preliminary via definition at the first offset from the first via location to generate a fourth candidate via definition of the set of candidate via definitions.

8. The computer readable medium of claim 5, wherein the set of executable instructions is to manipulate the at least one processor to adjust the preliminary weight for the at least one of the set of links by manipulating the processor to:
- identify the preliminary via definition associated with links having the highest total weight;
- identify a first set of links connected to the identified preliminary via definition;
- identify a set of offsets connected to the identified first set of links;
- identify a second set of links connected to the set of offsets; and
- generate a set of adjusted weights for the second set of links by subtracting the corresponding weight of one of the first set of links from the corresponding weights of the second set of links.

* * * * *